(12) United States Patent  
Moll et al.

(10) Patent No.: US 8,138,538 B2
(45) Date of Patent: Mar. 20, 2012

(54) INTERCONNECT STRUCTURE FOR SEMICONDUCTOR DEVICES

(75) Inventors: Hans-Peter Moll, Dresden (DE); Gouri Sankar Kar, Dresden (DE); Martin Popp, Dresden (DE); Lars Heineck, Radebeul (DE); Peter Lahnor, Dresden (DE); Arnd Scholz, Dresden (DE); Stefan Jakschik, Dresden (DE); Wolfgang Roesner, Ottobrunn (DE); Gerhard Enders, Olching (DE); Werner Graf, Dresden (DE); Peter Baars, Dresden (DE); Klaus Muemmler, Dresden (DE); Bernd Hintze, Langebrueck (DE); Andrei Josiek, Dresden (DE)

(73) Assignee: Qimonda AG, Munich (DE)

( * ) Notice: Subject to any disclaimer, the term of this patent is extended or adjusted under 35 U.S.C. 154(b) by 201 days.

(21) Appl. No.: 12/249,060

(22) Filed: Oct. 10, 2008

(65) Prior Publication Data

US 2010/0090264 A1    Apr. 15, 2010

(51) Int. Cl.
*H01L 27/108* (2006.01)
(52) U.S. Cl. .................. 257/302; 257/E21.658
(58) Field of Classification Search .......... 257/300, 257/301, 302, 296, 304, 330, 331, 332, E21.655, 257/E21.658, E21.659
See application file for complete search history.

(56) References Cited

U.S. PATENT DOCUMENTS

| 5,497,017 | A | 3/1996 | Gonzales |
| 6,104,061 | A | 8/2000 | Forbes et al. |
| 6,504,201 | B1 * | 1/2003 | Noble et al. ............... 257/302 |
| 6,750,095 | B1 | 6/2004 | Bertagnoll et al. |
| 7,109,544 | B2 | 9/2006 | Schloesser et al. |
| 2004/0188726 | A1 * | 9/2004 | Iriyama et al. ............. 257/288 |
| 2004/0235243 | A1 * | 11/2004 | Noble et al. ............... 438/243 |
| 2006/0017088 | A1 | 1/2006 | Abbott et al. |
| 2006/0043450 | A1 * | 3/2006 | Tang et al. ................ 257/302 |
| 2006/0113587 | A1 | 6/2006 | Thies et al. |
| 2006/0170031 | A1 * | 8/2006 | Kang et al. ................ 257/315 |
| 2008/0105933 | A1 * | 5/2008 | Yu et al. ................... 257/412 |

OTHER PUBLICATIONS

Office Action dated Sep. 9, 2010 issued to U.S. Appl. No. 12/249,225.
Office Action dated Mar. 9, 2011 issued to U.S. Appl. No. 12/249,225.

* cited by examiner

*Primary Examiner* — Evan Pert
*Assistant Examiner* — Selim Ahmed
(74) *Attorney, Agent, or Firm* — Eschweiler & Associates, LLC

(57) ABSTRACT

One embodiment relates to an integrated circuit formed on a semiconductor body having interconnect between source/drain regions of a first and second transistor. The interconnect includes a metal body arranged underneath the surface of the semiconductor body. A contact element establishes electrical contact between the metal body and the source/drain regions of the first and second transistor. The contact element extends along a connecting path between the source/drain regions of the first and second transistors. Other methods, devices, and systems are also disclosed.

25 Claims, 18 Drawing Sheets

US 8,138,538 B2

INTERCONNECT STRUCTURE FOR SEMICONDUCTOR DEVICES

FIELD OF INVENTION

The present invention relates generally to semiconductor devices and more particularly to improved methods and systems for interconnect structures.

BACKGROUND OF THE INVENTION

Several trends presently exist in the semiconductor and electronics industry. One trend is that recent generations of portable electronic devices are using more memory than previous generations. This increase in memory allows these new devices to store more data, such as music or images, and also may provide the devices with more computational power and speed.

One type of memory device includes an array of memory cells, where each cell includes a capacitor that stores data. Depending on the amount of charge stored in the capacitor, the capacitor can be switched between two or more states (e.g., a high-charge state and a low-charge state). In real world-implementations, the high-charge state can be associated with a logical "1" and the low-charge state can be associated with a logical "0", or vice versa. Additional charge states could also be defined to implement a multi-bit cell with more than two states per cell. Therefore, by switching between these states, a user can store any combination of "1"s and "0"s in the array, which could correspond to digitally encoded music, images, software, etc.

SUMMARY OF THE INVENTION

One embodiment relates to an integrated circuit formed on a semiconductor body having interconnect between source/drain regions of a first and second transistor. The interconnect includes a metal body arranged underneath the surface of the semiconductor body. A contact element establishes electrical contact between the metal body and the source/drain regions of the first and second transistor. The contact element extends along a connecting path between the source/drain regions of the first and second transistors. Other methods, devices, and systems are also disclosed.

DETAILED DESCRIPTION OF THE INVENTION

Figure 1:
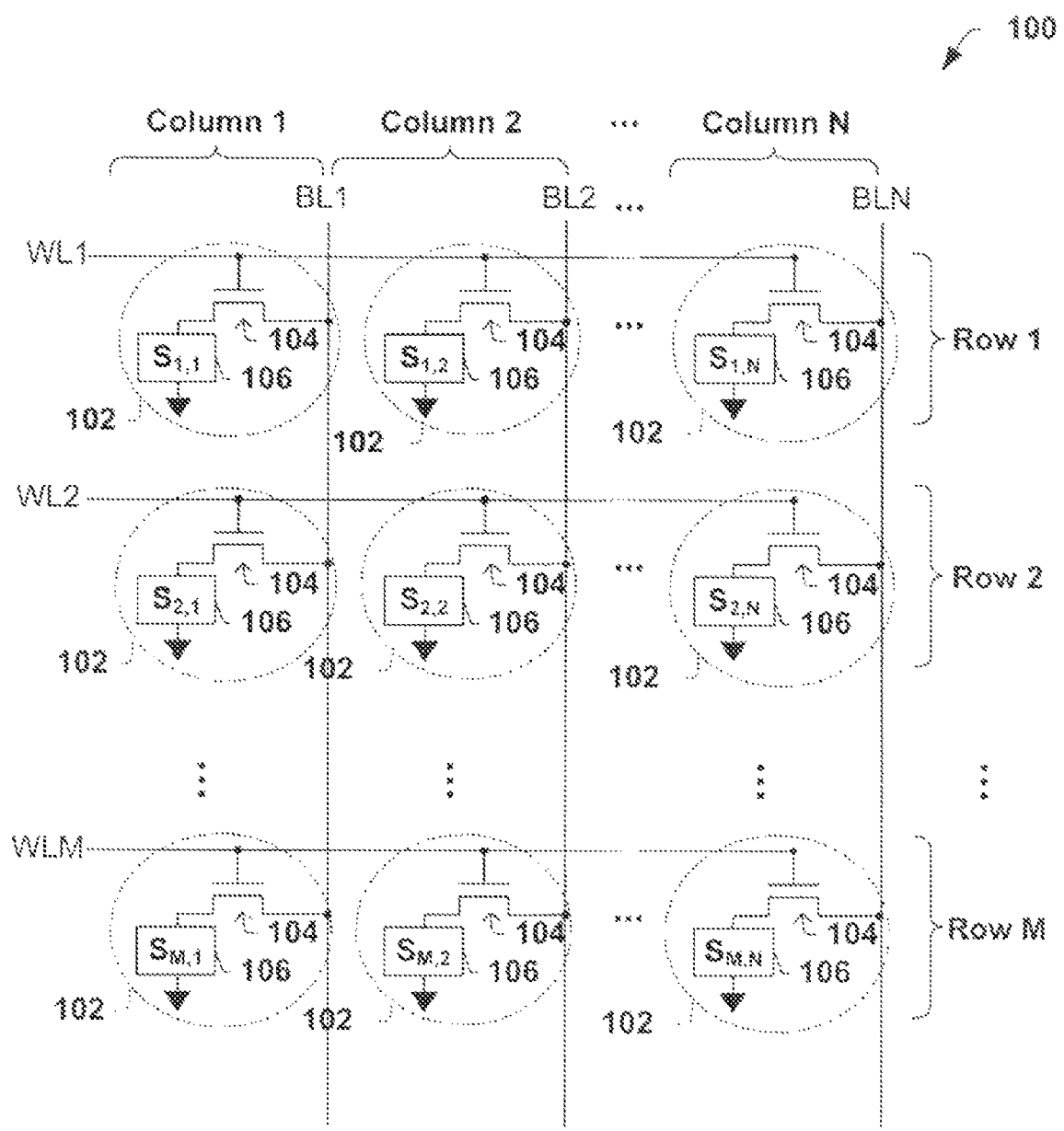
FIG. 1 shows one schematic depiction of a memory array that includes buried metal bitlines.

One or more implementations of the present invention will now be described with reference to the attached drawings, wherein like reference numerals are used to refer to like elements throughout. The drawings are not necessarily drawn to scale.

FIG. 1 depicts a memory array 100 that includes a number of memory cells 102. Each memory cell 102 includes an access transistor and a data storage element (indicated as $S_{Row-Column}$), where the storage element is capable of storing one or more bits of data. The memory cells 102 are arranged in M rows (e.g., words) and N columns (e.g., bits). Thus, each row of cells is an N-bit data word accessible by activation of a wordline WL associated with that row. For example, in Row-1 of the array 100, the storage elements $S_{1,1}$ through $S_{1,N}$ form an N bit data word that may be accessible by activation of wordline WL1 and written to and read from using bitlines BL1 through BLN. In alternative architectures, complimentary bitlines could be used for each column, and/or diodes could be substituted for the access transistors 104.

In some embodiments of the present invention, the bitlines comprise metal bitlines that are buried in a semiconductor body. Because the metal bitlines have lower resistances than other types of bitlines (e.g., doped-Si bitlines or polysilicon bitlines), these metal bitlines may provide better performance than other solutions. In some embodiments, these metal bitlines may be coupled to first and second access transistors via a contact element that extends along a connection path between source/drain regions of the first and second access transistors. Such a contact element may be single-sided or double-sided, and may comprise one of several different geometries. Some examples of single-sided and double-sided contact elements, as well as geometries for such contact elements are disclosed in more detail further herein.

Figure 2:
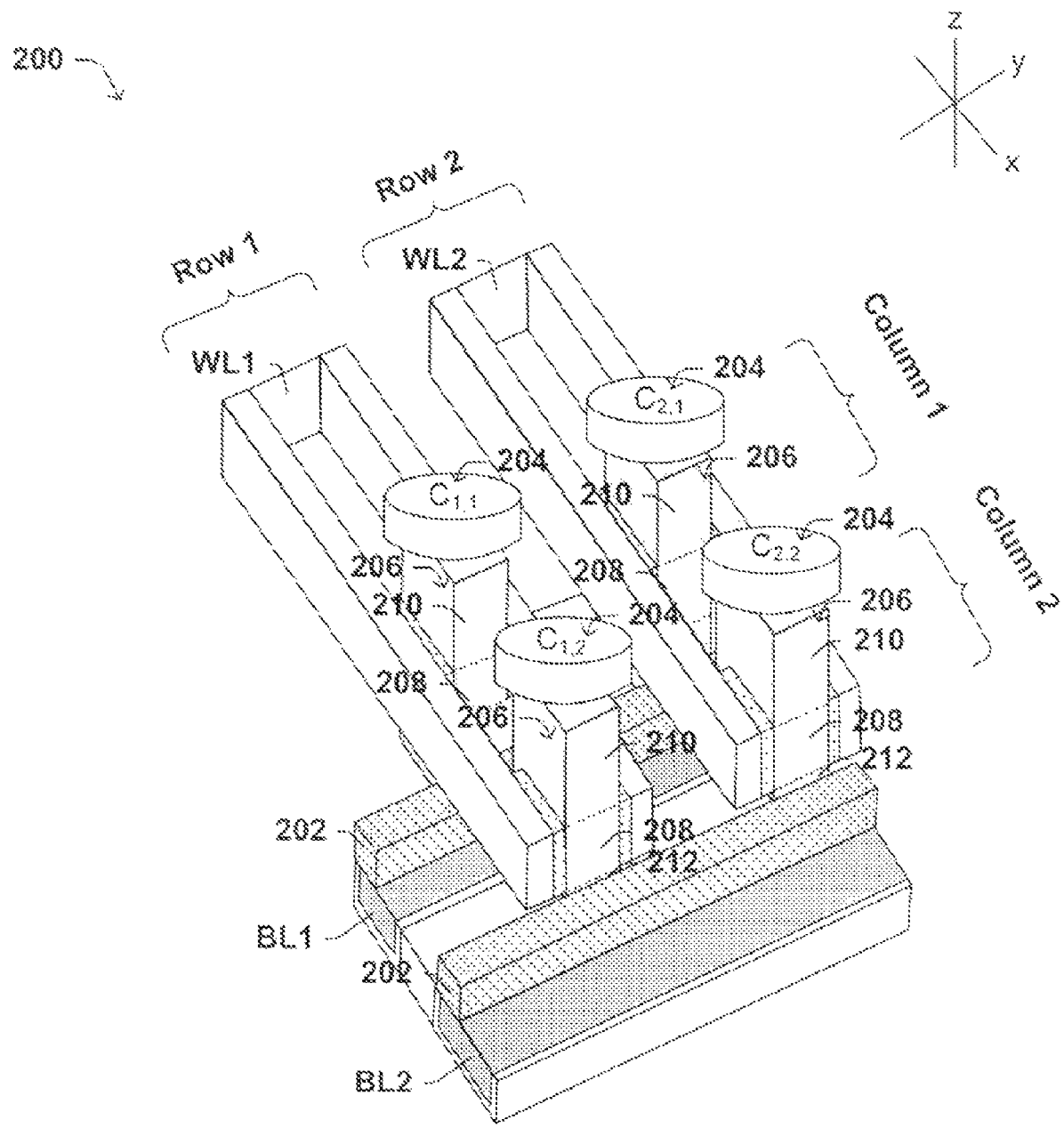
FIG. 2 shows a perspective drawing of a more detailed embodiment that includes single-sided contacts elements.

Referring now to FIG. 2, one can see a more detailed embodiment of a portion of a memory array 200 that includes single-sided contact elements 202 that extend along a connection path between first and second transistors. For purposes of clarity and succinctness, this array 200 includes only two rows (i.e., Row1 and Row2) and two columns (i.e., Column1 and Column2). In other embodiments, an array could include any number of rows and columns.

The memory array 200 includes a memory cell at the intersection of each column and each row. Like FIG. 1's embodiment, each memory cell includes an access transistor and a storage element. However, in FIG. 2's embodiment, the storage elements are capacitive storage elements 204, indicated as $C_{Row-Column}$. Each capacitive storage element is disposed atop a semiconductor pillar 206, where adjacent pillars are separated from one another by trenches in the semiconductor body. Split wordlines WL1, WL2 run alongside each row so as to span a body region 208 in each pillar 206. The two segments of each split wordline may be connected between adjacent pillars (resulting in a ladder-like structure). Source/ drain regions 210, 212 vertically flank the each body region 208, thereby establishing vertical access transistors. Buried metal bitlines BL1, BL2 run along each column (e.g., perpendicular to the wordlines WL1, WL2), and single-sided contact elements 202 couple the metal bitlines BL1, BL2 to source/drain regions 212 of at least two pillars 206 in a given column.

To access a row of capacitive storage elements 204, a memory controller asserts a split wordline (e.g., WL1). This frees electrical carriers from the semiconductor lattice in the body regions 208 of the row, thereby electrically coupling the buried bitlines (BL1 and BL2) of the row to the corresponding storage capacitors (e.g., $C_{1,1}$ and $C_{1,2}$, respectively).

While the wordline is activated, data values can be written to the cell by asserting or de-asserting the bitlines, thereby placing a predetermined charge on the corresponding storage capacitors. After a write operation, the split wordline is de-activated, which tends to store the charge in the capacitors 204 for later read operations. Because charge may leak from the capacitors 204, refresh operations may be periodically used.

While the wordline is activated, data values can be read from the cell by floating the bitlines, causing some amount of charge to leak from the storage capacitors 204 onto the corresponding bitlines. Sense amps (not shown) could determine the bit values stored in the capacitors 204, for example, by comparing the charge on the bitlines (e.g., a voltage or current on the bitlines) to that of similar bitlines of reference cells. Depending on how the charge on the bitlines compares to the reference cells, the memory cells will be deemed to have a "1" or "0" stored therein. Because read operations change the charge in the storage capacitor 204 (i.e., reads are "destructive"), it may be beneficial to write back read values to the capacitors 204 after a read access.

To more clearly show one embodiment of the above described memory array 200, FIGS. 3-6 show cross-sectional and top-level views of the array 200.

Figure 3:
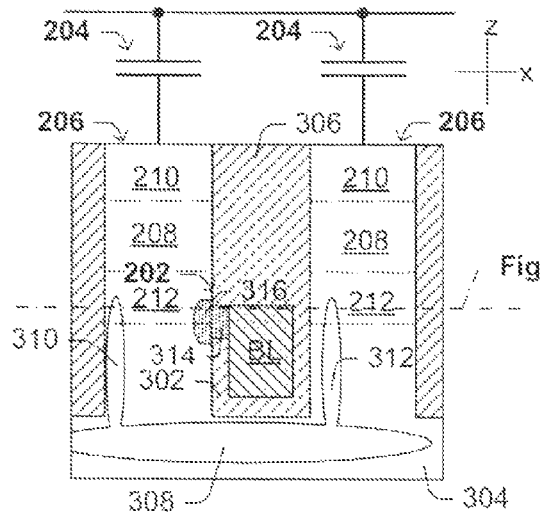
FIG. 3 shows a cross-sectional view of FIG. 2's embodiment looking along bitline 1.

FIG. 3 shows a cross-sectional view looking along Column 1. As shown, a gate insulating layer 302 is disposed in the trench to facilitate electrical isolation the metal bitline BL from the semiconductor body 304, and a continuous dielectric cap 306 is formed over the metal bitline BL. Lateral well 308 and vertical wells 310, 312 of a first conductivity (e.g., p-type) are disposed in the semiconductor body 304, where the semiconductor body has a second conductivity (e.g., n-type). This arrangement establishes p-n junctions (diodes) that facilitate electrical isolation of adjacent bitlines from one another.

Figure 4:
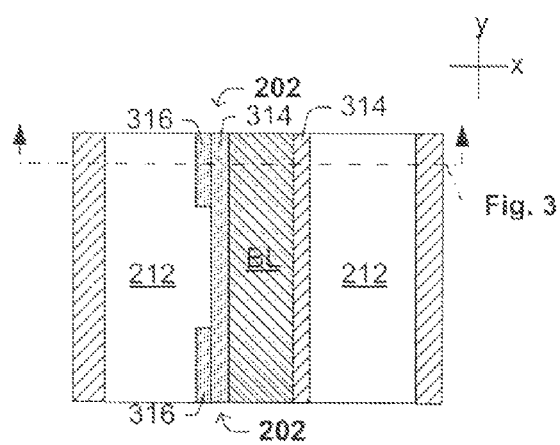
FIG. 4 shows a top view of FIG. 3's embodiment.

As can be seen from FIG. 4 (top view of FIG. 3 at single-sided contact element level 202 as shown), the single-sided contact element 202 runs continuously along a connection path between at least two pillars 206 of a column. In some embodiments, the single-sided contact element 202 runs along the connection path to abut source/drain regions of every pillar in a given column. The single-sided contact element 202 includes a horizontal portion 314 that bridges the gate insulating layer 302 between the bitline BL and the pillar 206, as well as an out-diffused region 316 that extends into the pillar 206.

Figure 5:
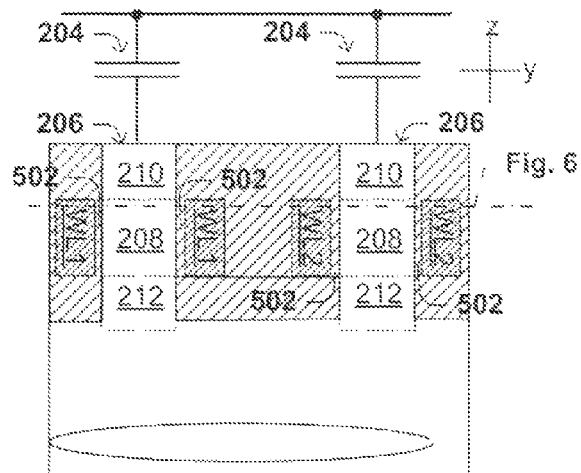
FIG. 5 shows a cross-sectional view of FIG. 2's embodiment looking along the rows.
Figure 6:
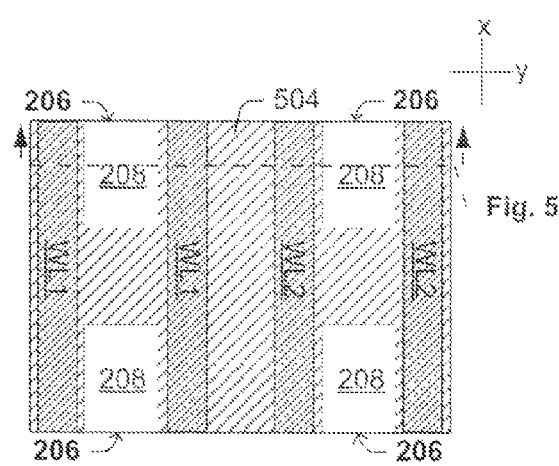
FIG. 6 shows a top view of FIG. 5's embodiment.
Figure 7:
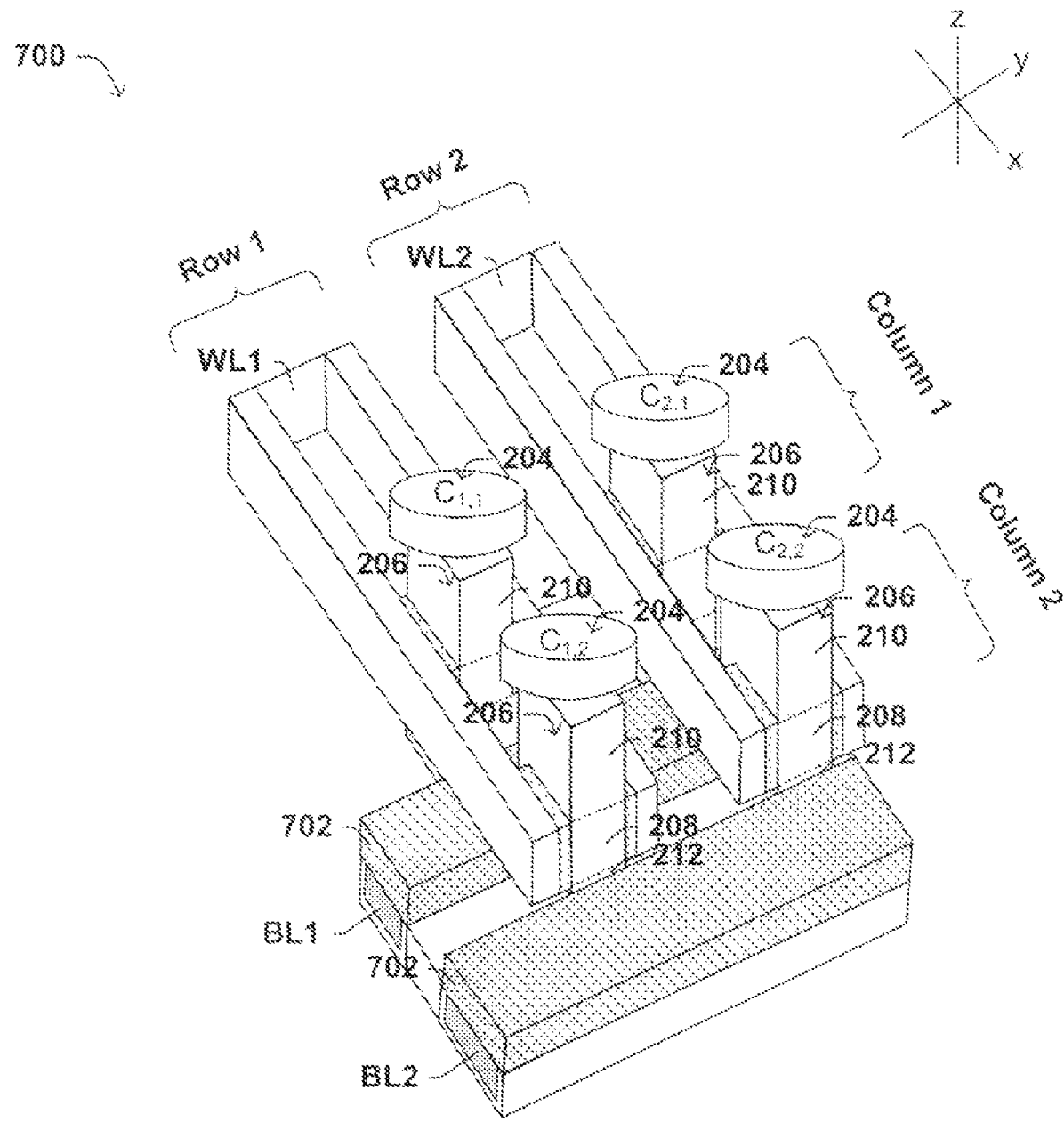
FIG. 7 shows a perspective drawing of a more detailed embodiment that includes double-sided contact elements.
Figure 8:
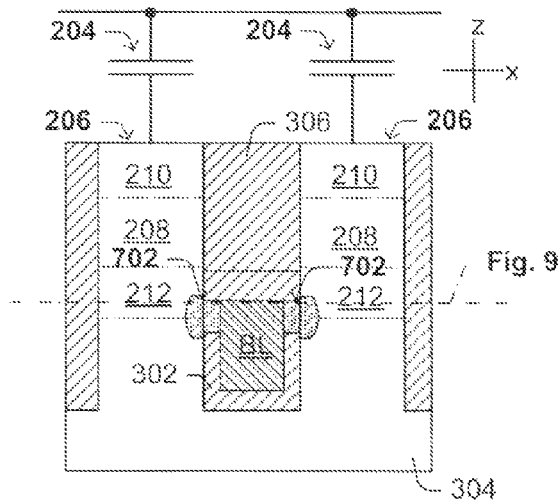
FIG. 8 shows a cross-sectional view of FIG. 7's embodiment looking along bitline 1.
Figure 10:
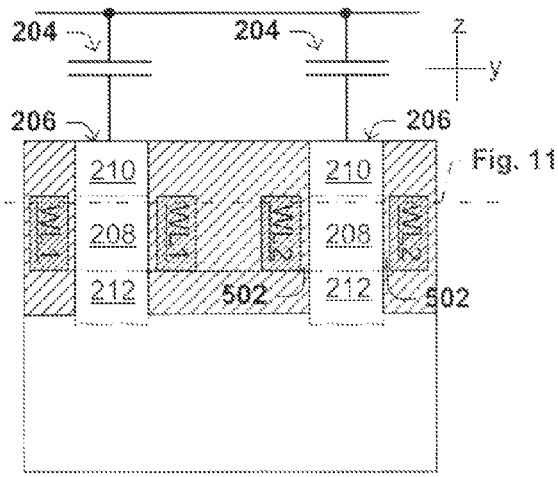
FIG. 10 shows a cross-sectional view of FIG. 7's embodiment looking along the rows.
Figure 9:
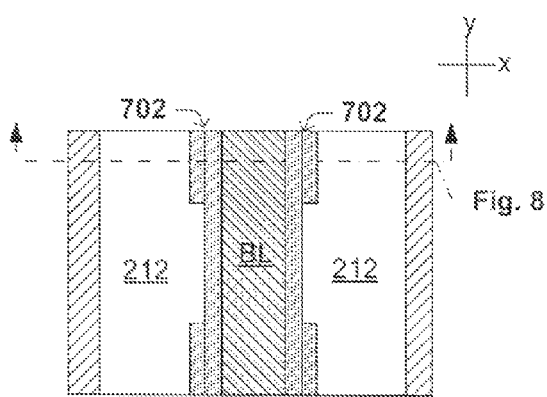
FIG. 9 shows a top view of FIG. 8's embodiment.
Figure 11:
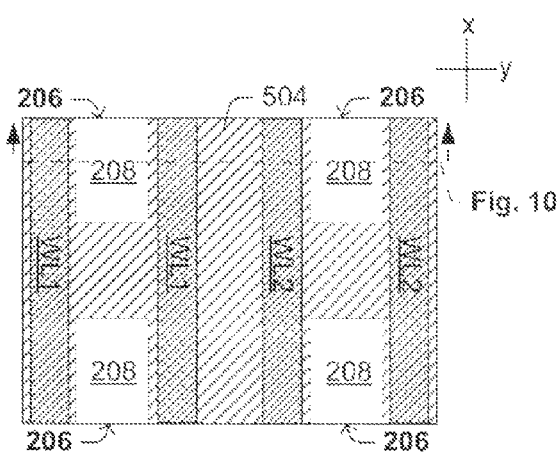
FIG. 11 shows a top view of FIG. 10's embodiment.

FIG. 5 shows a cross-sectional view looking along a row. As shown, buried conductive wordlines WL1, WL2 are disposed about opposite sides of pillars 206. A gate dielectric layer 502 electrically separates each wordlines from each pillar 206. Body regions 208, which have a first doping type (e.g., p-type), are disposed in the pillars 206 so as to vertically correspond to the wordlines. Source/drain regions 210, 212, which have a first doping type (e.g., n-type), are vertically disposed about sides of the body regions 208. For completeness, FIG. 6 shows a top view of FIG. 5 at the wordline level, as shown.

FIGS. 7-11 show a more detailed embodiment of a portion of a memory array 700 that includes double-sided contact elements 702 that extend along a connection path between first and second transistors. In this embodiment, the double-sided contact elements 702 are similar to the previously discussed single-sided contact elements in many respects, but couple to both pillars on opposing sides of a given trench.

FIGS. 12-23 show several different geometries for contact elements. Any of these contact elements could extend along a connection path as described in the memory array 200, but could also extend between any two or more transistors on any type of integrated circuit. In other words, these contact elements are not limited to memory arrays or memory devices.

Figure 12:
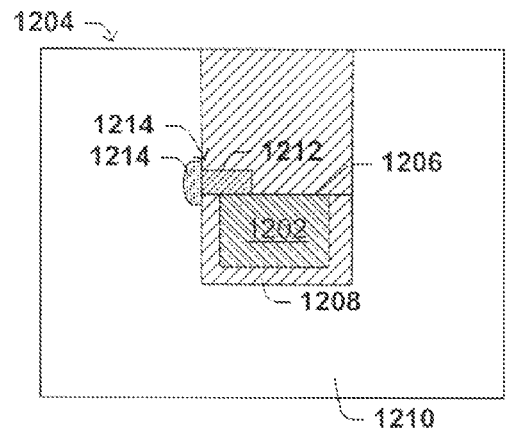
FIGS. 12-23 show several different geometries that can be used for the buried bitlines and contact elements associated therewith.

In FIG. 12, a single-sided contact element 1200 electrically couples a metal body 1202 to a silicon pillar 1204 (e.g., source/drain region). In this embodiment, the single-sided contact element 1200 abuts a top surface 1206 of the metal body 1202 without extending alongside the metal body. A dielectric layer 1208 separates the metal body from the silicon body 1210. The single-sided contact element 1200 includes a horizontal portion 1212 that bridges the insulating layer 1208 between the metal body 1202 and the pillar 1204, as well as an out-diffused region 1214 that extends into the pillar 1204.

Figure 13:
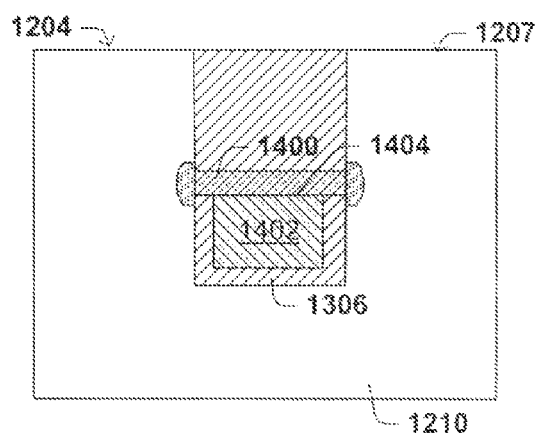

In FIG. 13, a double-sided contact element 1400 abuts a top surface 1404 of the metal body 1402 and both silicon pillars 1204, 1207 on opposing sides of the trench. In this way, the double-sided contact element 1400 electrically couples the metal body 1402 to both silicon pillars 1204, 1207. In this embodiment, the double-sided contact element lies over the top surface 1404 without extending alongside the metal body.

Figure 14:
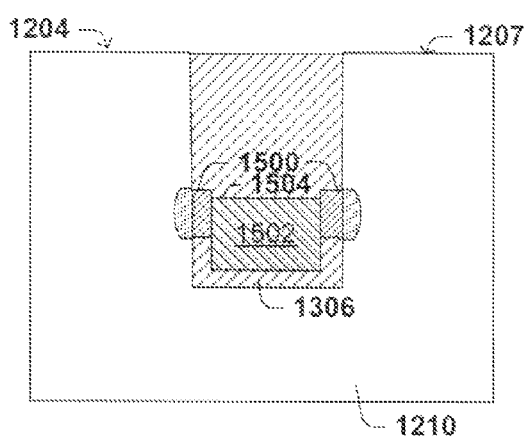

In FIG. 14, a double-sided contact element 1500 is formed along-side a metal body 1502 without extending over a top surface 1504 of the metal body. In this embodiment, the double-sided contact element 1500 includes two metal lines that run alongside opposite sides of the metal body.

Figure 15:
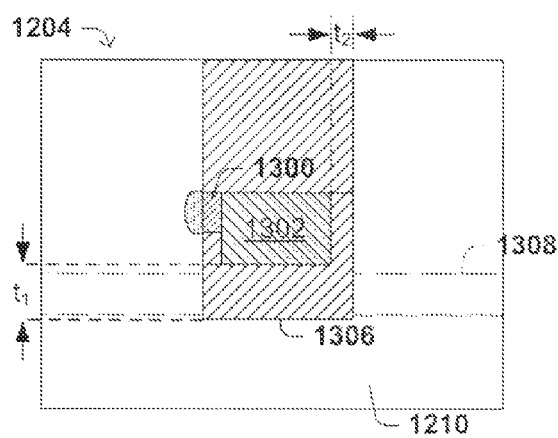

In FIG. 15, a single-sided contact element 1300 is formed along-side a metal body 1302 without extending over the metal body. In some embodiments where the single-sided contact element is formed along-side the metal body, a dielectric layer 1306 will have a thickness $t_1$ on the bottom of the trench that is greater than a thickness $t_2$ on the sidewalls of the trench. This increased thickness $t_1$ may be particularly advantageous in memory arrays where a well 1308 (e.g., p-well) is formed under the entire array. The increased thickness $t_1$ facilitates the use of a high-dose implant for the well 1308, thereby limiting the resistance of the well and reducing coupling between the metal body 1302 and the well. This reduced coupling ultimately may promote better signal margins when a memory cell is accessed.

Figure 16:
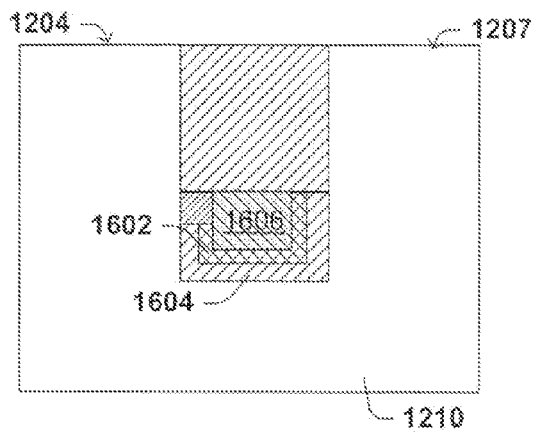

FIGS. 16-17 show embodiments where the metal body includes multiple metal layers. Like other embodiments in this application, these embodiments may be combined with any other embodiments herein.

In FIG. 16, a first metal layer 1602 is disposed along the sidewalls of the trench, where the trench is lined with a dielectric layer 1604. A second metal layer 1606 is disposed over the first metal layer 1602. Depending on the implementation, these metal layers 1602, 1606 could have the same or different compositions and can be tailored to achieve a particular workfunction. Although these embodiments show two sub-layers for the metal body, more than two sub-layers could also be used in some un-illustrated embodiments.

Figure 17A:
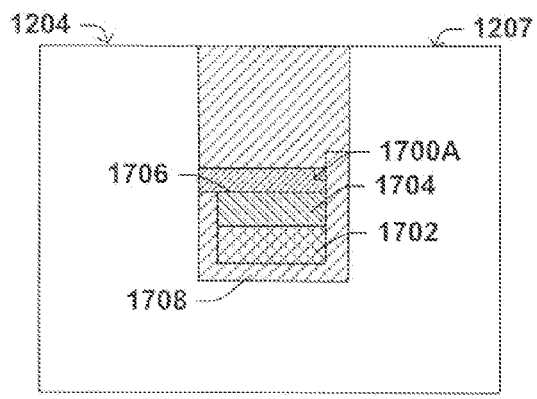
Figure 17B:
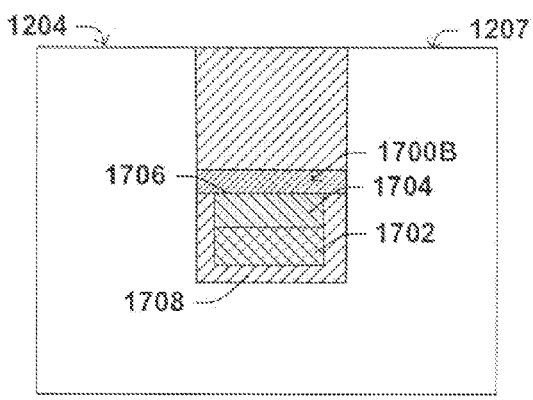

FIG. 17A illustrates a single-sided contact element 1700A that couples a metal body having first and second metal layers 1702, 1704, respectively to the pillar 1204. FIG. 17B illustrates a double-sided contact element 1700B. The contact elements 1700A, 1700B are disposed over a top surface 1706 of the second metal layer 1704. A dielectric layer 1708 again separates the metal body from the semiconductor body.

Figure 18:
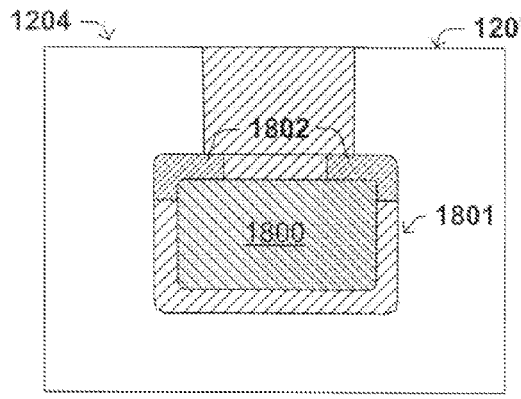

FIG. 18 shows another embodiment where the metal body 1800 is formed in a pocket or recess 1801 at or near the bottom of a trench, where the recess has a width that is larger than the sidewalls of the trench. In this example, a double-sided contact element 1802 extends over and alongside the metal body, so as to electrically couple the metal body 1800 to the silicon pillars 1204, 1207 on opposing sides of the trench. The double-sided contact element 1802 may comprise separate sections (as shown), or may be formed from a single piece (similar to the one shown in FIG. 14). This embodiment may be useful in that it allows a wider metal body to be formed, which tends to reduce the resistance of the metal body 1800 compared to other embodiments.

Figure 19:
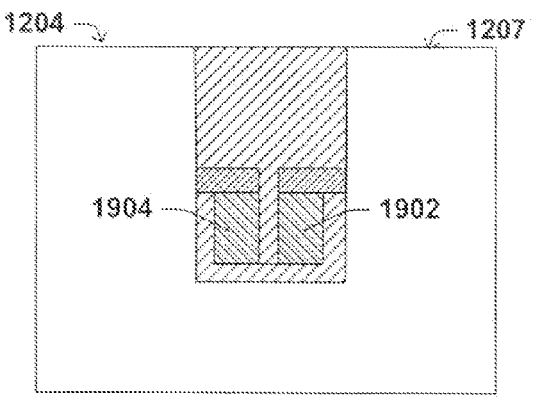

FIG. 19 shows still another embodiment where the metal body is split. In this manner, the pillars on opposite sides of the trench may be coupled to metal bodies 1902, 1904 that are electrically separate from one another. This "split-interconnect" may allow particularly dense data storage in a memory array. The "split interconnect" configuration may as well be realized together with any other of the metal body configurations shown in FIGS. 12-18.

Figure 20:
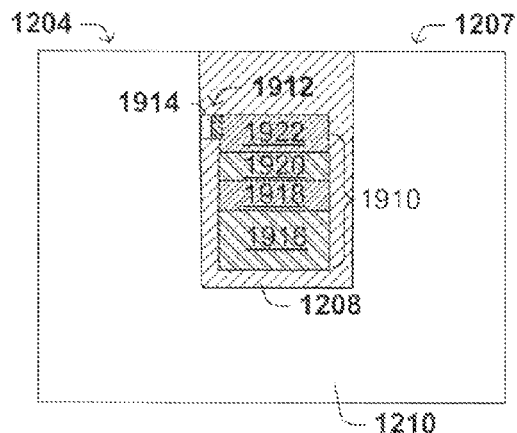

FIG. 20 shows still another embodiment where a buried bitline 1910 is coupled to a pillar 1204 by a contact element 1912, wherein the contact element 1912 includes an optional SiN layer 1914. This SiN layer 1914 may be advantageous in that it provides a very low resistivity for the contact element 1912. In one embodiment, for example, the SiN layer 1914 may facilitate the contact element having a resistivity that is approximately 50 ohms/um$^2$ or less. In one embodiment, this buried bitline 1910 may comprise a tungsten (W) body 1916, a tungsten-nitride interface layer (WN) 1918, a titanium (Ti) layer 1920 formed by phase-vapor deposition (PVD), and an n-type polysilicon layer 1922. Correspondingly, the contact element 1912 may comprise an Si/SiN/n-type polysilicon tunnel interface.

Figure 21:
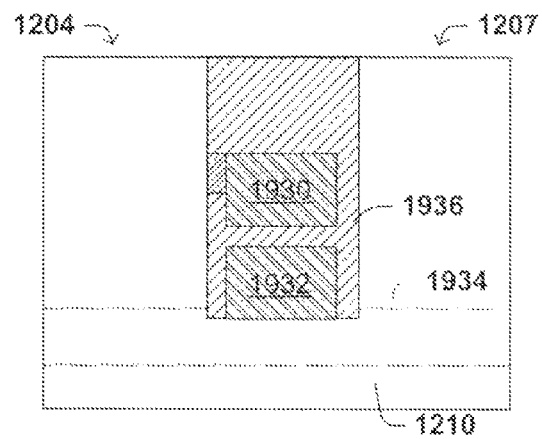

FIG. 21 shows still another embodiment where a buried bitline 1930 is disposed over a conductive contact 1932 coupled to a well 1934 underneath the buried bitline 1930. In some embodiments, the conductive contact 1932 can comprise polysilicon and the buried bitline 1930 can comprise Ti—N. A dielectric layer 1936, such as oxide, isolates the buried bitline 1930 from the conductive contact 1932. This embodiment may be advantageous because it streamlines processing and may provide for more compact layout than previous well contact arrangements.

Figure 22:
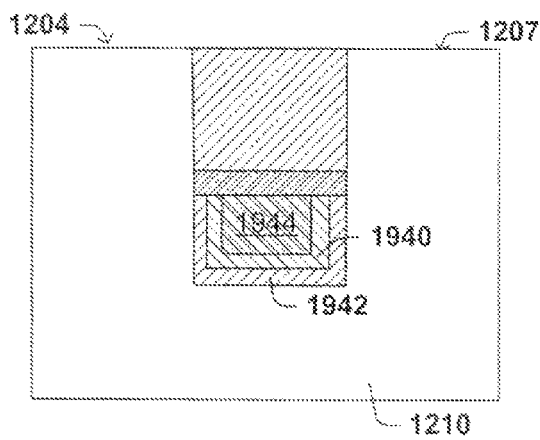

FIG. 22 shows still another embodiment where a second insulating layer 1940 is formed over a first insulating layer 1942. In some embodiments, the second insulating layer 1940 comprises a high-k dielectric and the first insulating layer 1942 comprises oxide. This arrangement increases the work-function of the bitline 1944, and may increase the voltage threshold ($V_T$) of the transistors in the pillars 1204, 1207. In some embodiments, the high-k dielectric material can be formed on only one side of the trench, and not on both sides of the trench as shown.

Figure 23:
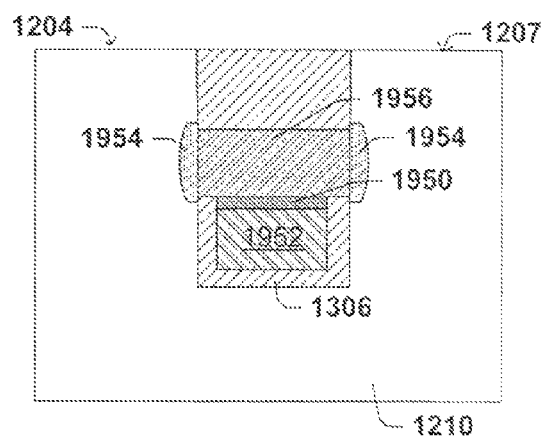

In FIG. 23, a thin Ti-silicide layer 1950 is formed on the top surface of the metal body 1952. This silicide layer 1950 will facilitate formation of an ohmic contact between the metal body 1952 and the semiconductor pillar 1204 (e.g., source/drain region associated with the outdiffused region 1954). More particularly, the silicide layer 1950 prevents Ti—Si grain boundaries, which could otherwise damage the array. During manufacture of the Ti-silicide layer 1950, the metal body 1952 is formed in the trench and then recessed. The out-diffused region 1954 is formed and subsequently a metal/semiconductor interface layer 1956 is formed on top of the metal body 1952. The metal/semiconductor interface layer 1956 can be formed over the metal body 1952 when Ti is selectively deposited on the metal body (e.g., W), after which polysilicon is deposited in-situ. Because the Ti—Si is selective, it is formed only in the trench and does not damage the active area in the pillars. This selective deposition can be carried out by using TiCl$_4$ and H$_2$ gas in a reaction chamber over the substrate. The H$_2$ gas is allowed to dissociate on metal body 1952, allowing the Ti to be selectively deposited on the metal body. Then, while still in the reaction chamber, a silicon liner is formed at above 500°, thereby locally siliciding the Ti in contact to the Si.

Figure 24A:
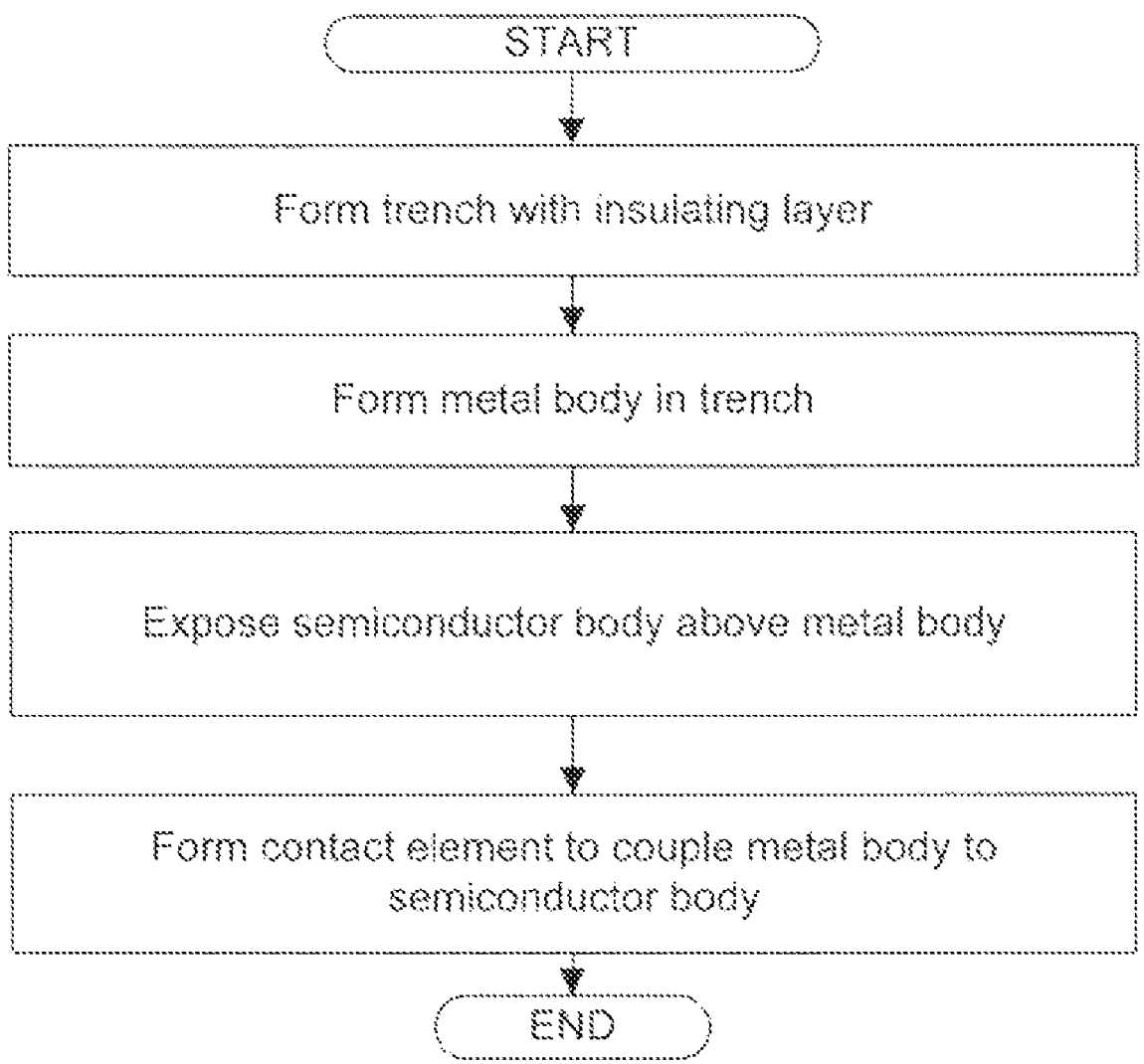
FIGS. 24A-24B show flowcharts for manufacturing flows in accordance with some embodiments.
Figure 24B:
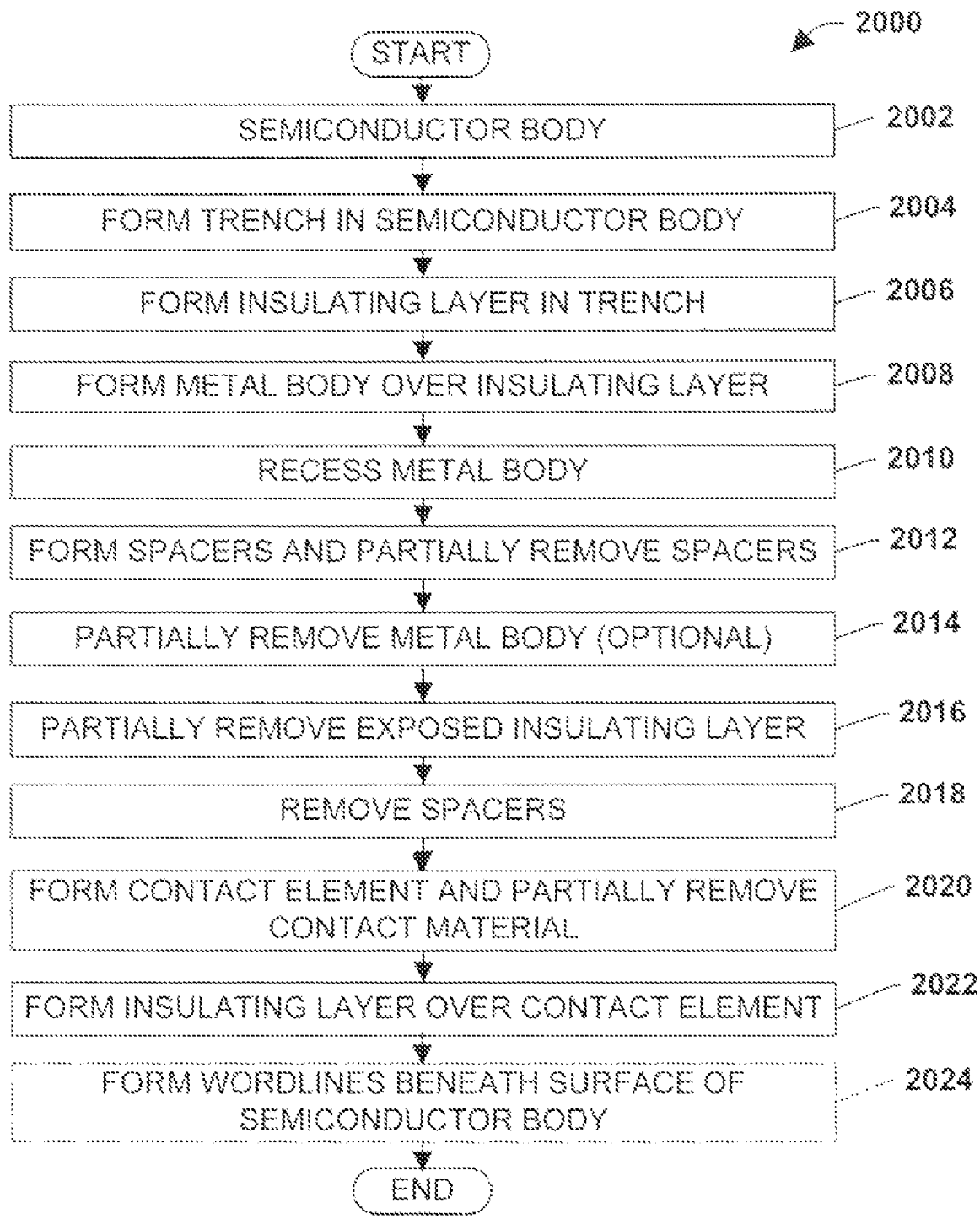

Now that some illustrative structural and functional features have been illustrated and described, reference is made to FIG. 24A-24B, which show flow diagrams of exemplary methodologies for forming interconnect that includes a buried metal body. To show some specific examples of how FIG. 24B could be implemented, FIGS. 25-33 show a series of cross sectional views of a double-sided contact element at various stages of manufacture, and FIGS. 34-38 show a series of cross sectional views of a singled-sided contact element at various stages of manufacture. Although these cross-sectional views show examples of how the interconnect could be formed, there are also other ways in which the interconnect could be formed that also fall within the scope of the present invention. While method 2000 is illustrated as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

Figure 25:
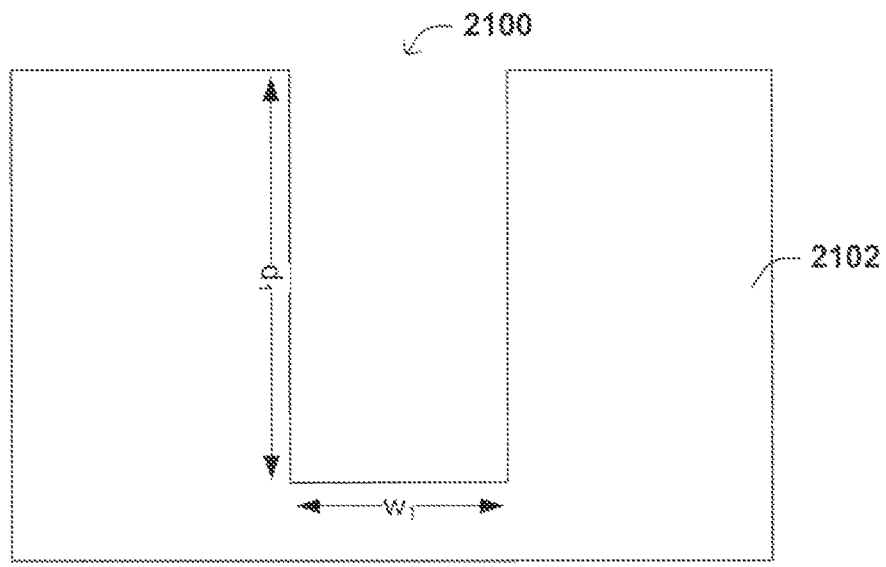
FIGS. 25 through 33 show cross sectional views of a double-sided contact element at various manufacturing stages consistent with FIG. 24B's embodiment.

Referring now to FIGS. 25-33, formation of a double-sided contact starts in FIG. 25 (2004) where a trench 2100 has been formed in a semiconductor body 2102. In some embodiments, the trench 2100 could be formed by reactive ion etching (RIE). In these and other embodiments, the trench may have a width $w_1$ ranging from approximately 100 nm to approximately 20 nm, and may have a depth $d_1$ ranging from approximately 100 nm to approximately 500 nm. It will be appreciated that the semiconductor body 2102 may comprise a simple Si substrate or any other type of semiconductor body, which may include non-semiconductor materials (e.g., oxide in SOI, partial SOI substrate, polysilicon, amorphous silicon, organic materials). Thus, the semiconductor body may include semiconductor/non-semiconductor and/or deposited or grown (e.g. epitaxial) layers formed on a semiconductor substrate and/or otherwise associated therewith.

Figure 26:
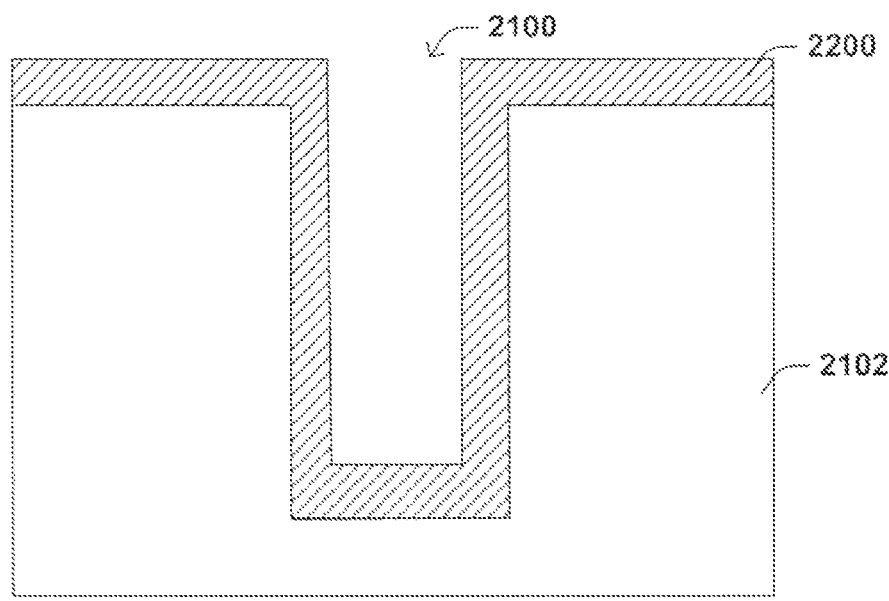

In FIG. 26 (2006), an insulating layer 2200 is conformally formed along sidewalls of the trench 2100. This insulating layer 2200 could comprise Silicon dioxide (SiO$_2$), or other types of dielectric. The insulating layer 2100 is often relatively thin, and could for example, have a thickness ranging from approximately 4 nm to approximately 10 nm in some embodiments.

Figure 27:
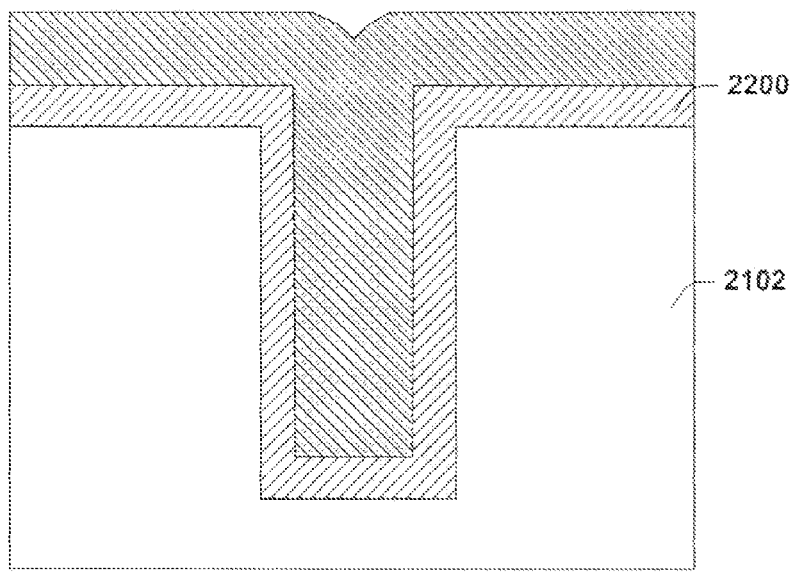

In FIG. 27 (2008), a metal body 2300 is formed over the insulating layer 2300. In some embodiments, the metal body material could comprise W, Ti, TiN, Ru, or other Ti-based materials. The metal body 2300 could also comprise multiple sub-layers of different compositions.

Figure 28:
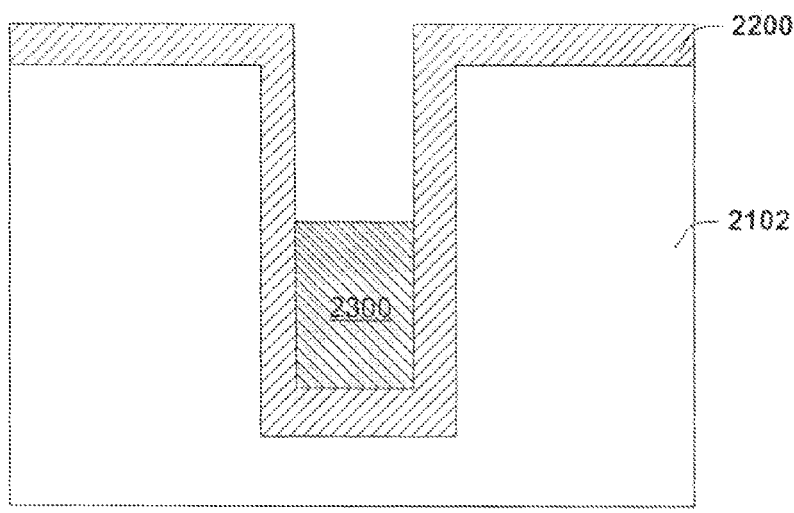

In FIG. 28 (2010), the metal body 2300 is partially removed to form a recess 2400 extending below the upper surface of the semiconductor body 2102. In some embodiments, this partial removal could be achieved by reactive ion etching.

Figure 29:
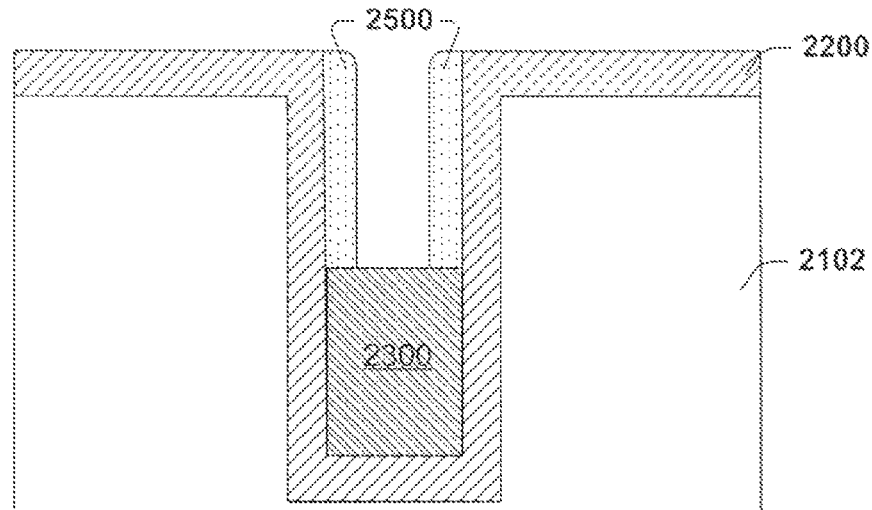

In FIG. 29 (2012) spacers 2500 are formed and etched so as to conform to the sidewalls of the recess. In some embodiments the spacer material could include, but is not limited to: SiN, TiN, or polysilicon, among others.

Figure 30:
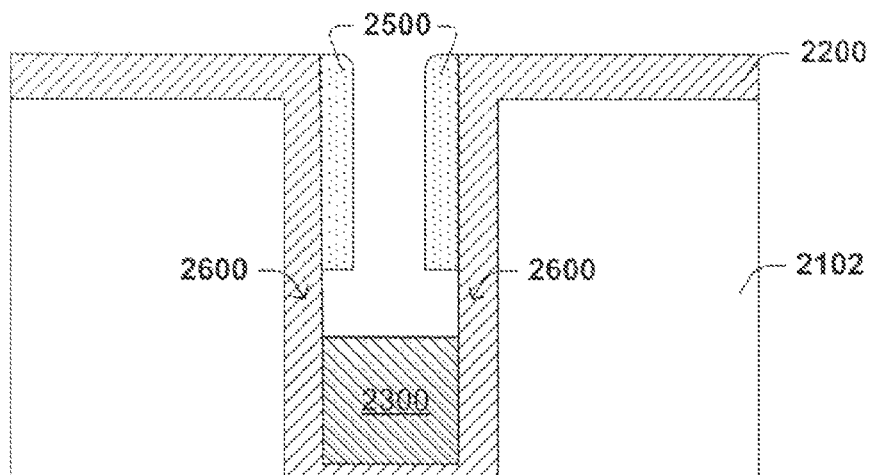

In FIG. 30 (2014), the metal body 2300 is partially removed to expose portions 2600 of the insulating layer 2200.

Figure 31:
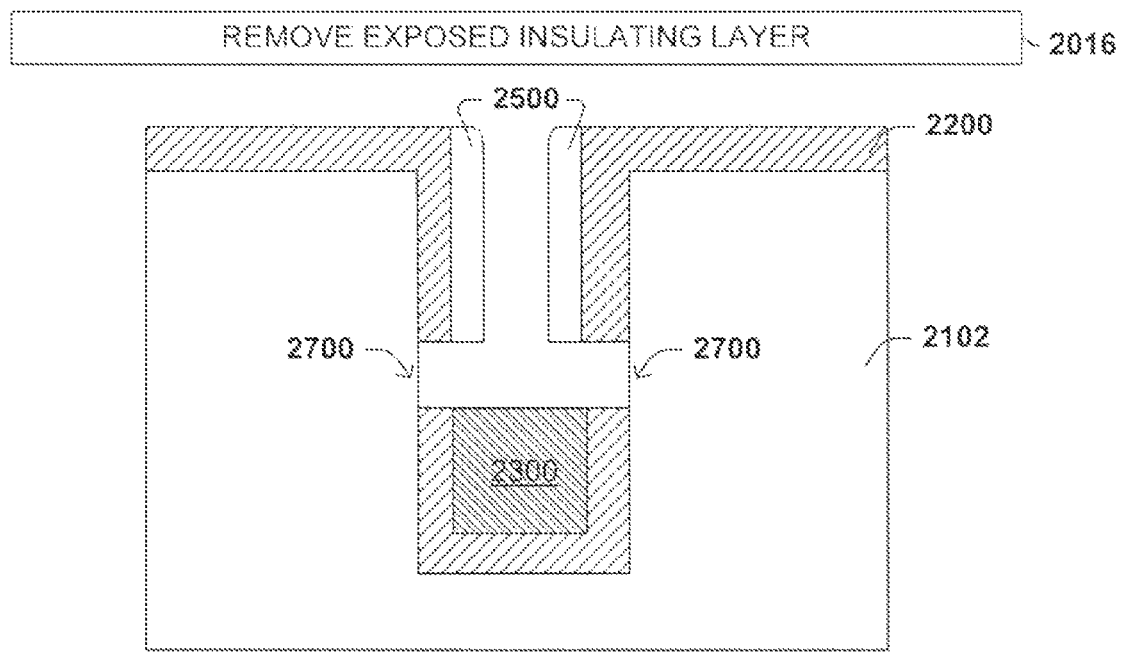

In FIG. 31 (2016), the exposed portions of the insulating layer 2600 are removed via an etch that is selective to the insulating layer 2200. Thus, this etch exposes surfaces 2700 of opposing pillars adjacent to the trench.

Figure 32:
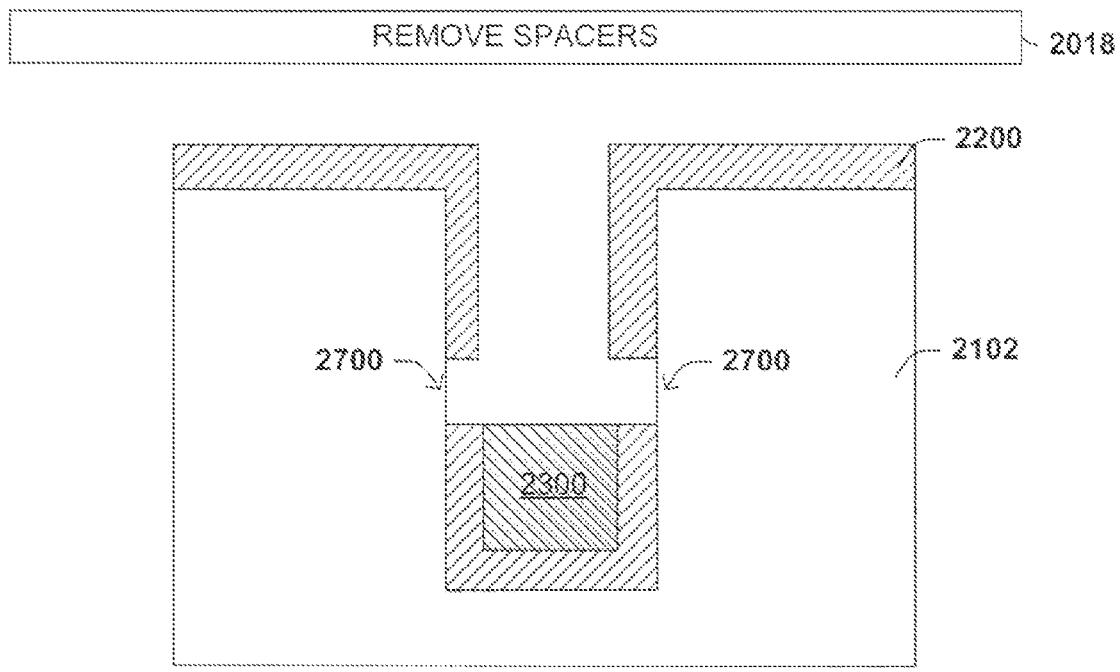

In FIG. 32 (2018), the spacers 2500 are removed.

Figure 33:
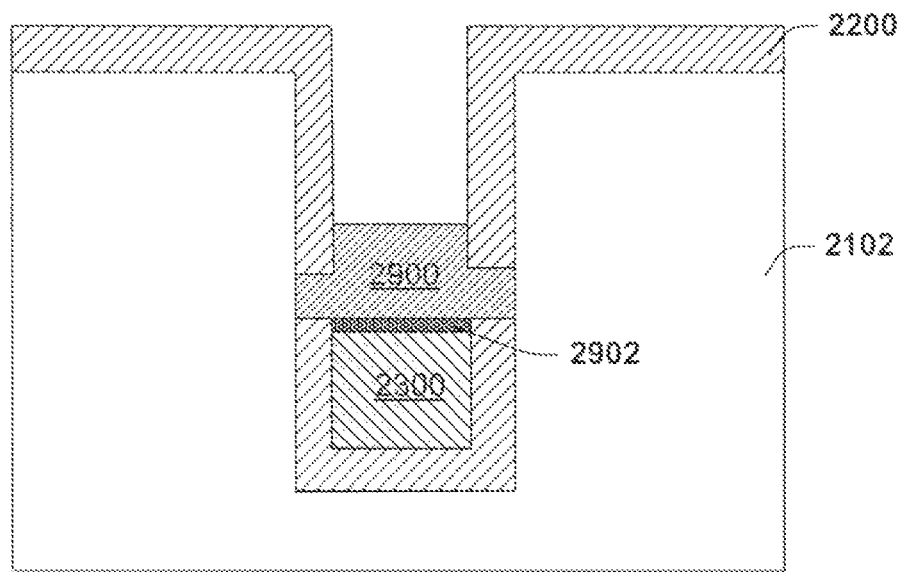

In FIG. 33 (2020), a double-sided contact element 2900 is formed, for example, by a deposition of the contact material followed by partial removal of the contact material. In some embodiments, the contact material could comprise doped poly, among others. In some embodiments, an interface layer 2902 might be used to ensure a good metal to semiconductor connection. This interface could include, for example, TiN, SiN, SiO, TiSi, CoSi, among others. Although not shown in cross-sectional views, buried conductive wordlines could be formed, as could upper level interconnect layers. Oxide or other insulating layers isolate these conductive wordlines from each other, as well as from the interconnect layers.

Figure 34:
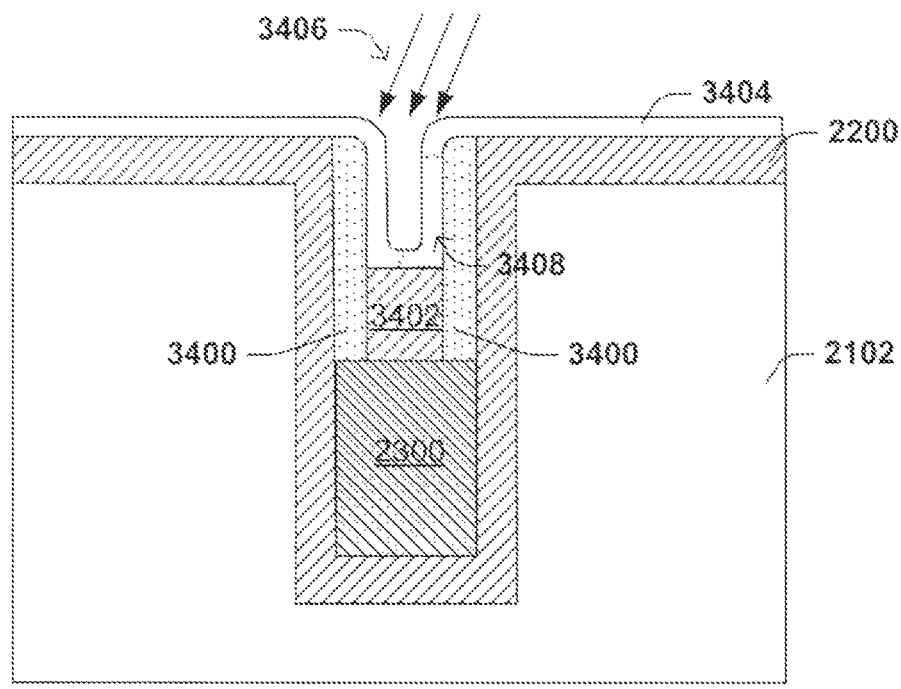
FIGS. 34-38 show cross sectional views of a single-sided contact element at various manufacturing stages consistent with FIG. 24B's embodiment.

Although the above described manufacturing flow shows the formation of a double-sided contact element, single-sided contact elements could also be formed. Referring now to FIGS. 34-38, formation of a single-sided contact is shown (stemming from previously discussed FIG. 29). In FIG. 34, sidewall spacers 3400 are formed along opposing sides of the trench. Next, a sacrificial layer 3402, such as polysilicon is formed in the trench between the spacers 3400. The sacrificial layer 3402 is recessed, and a liner 3404 is formed over the resulting structure. An angled implant 3406 is then carried out. This angled implant 3406 damages the liner layer 3404 in all regions, except for shadowed regions 3408, which remain undamaged.

Figure 35:
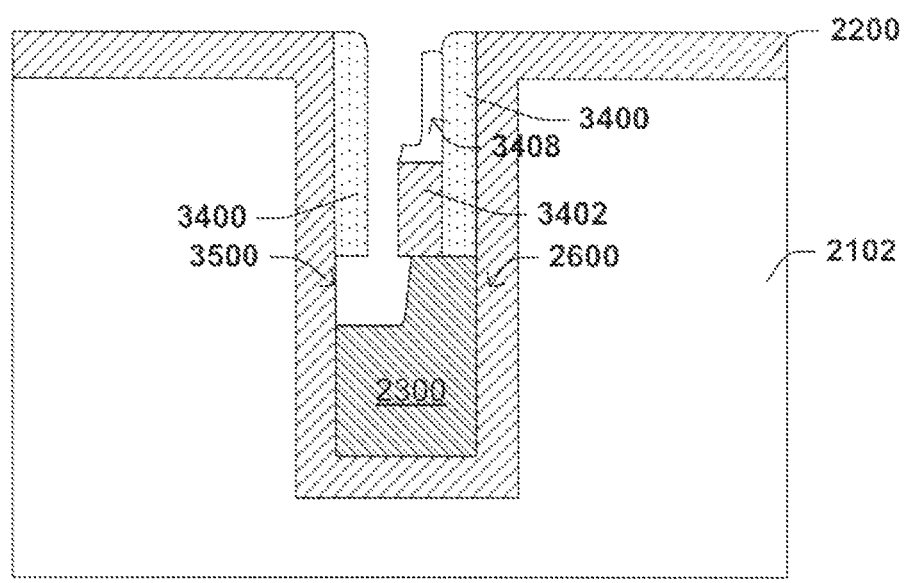

In FIG. 35, the damaged regions of the liner layer are selectively removed. This results in only the shadowed regions 3408 remaining in place. Next, one or more additional selective etches are performed to remove the exposed sacrificial layer 3402 and the metal body 2300 thereunder. In this manner, some exposed areas 3500 of the insulating layer 3500 are created.

Figure 36:
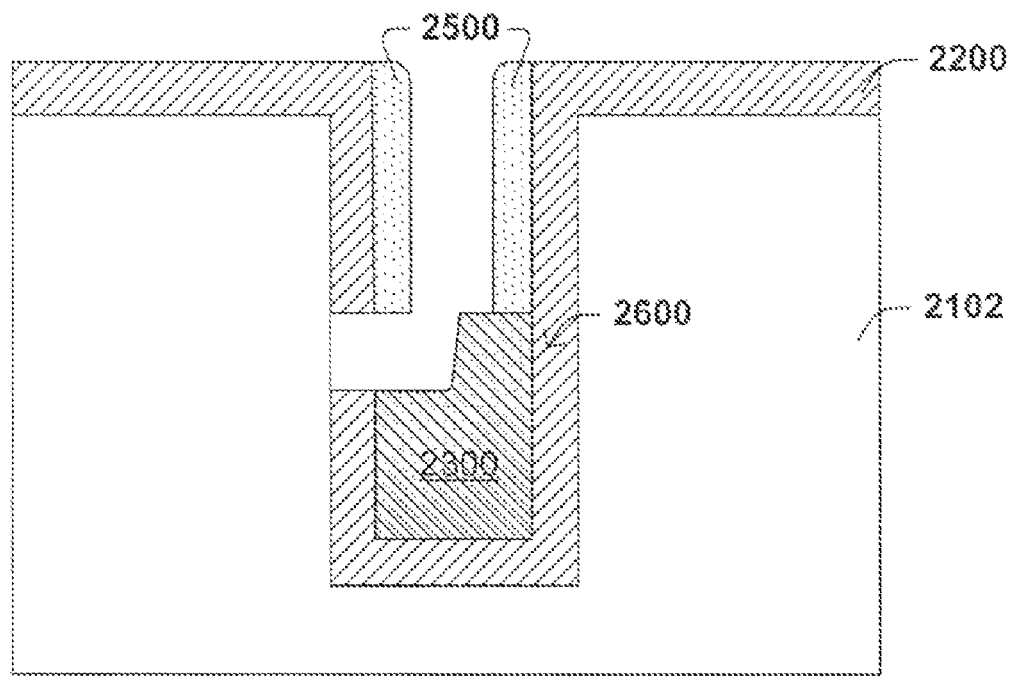

In FIG. 36, another selective etch is carried out to remove the exposed areas 3500 of the insulating layer. This exposed the sidewall of the semiconductor pillar.

Figure 37:
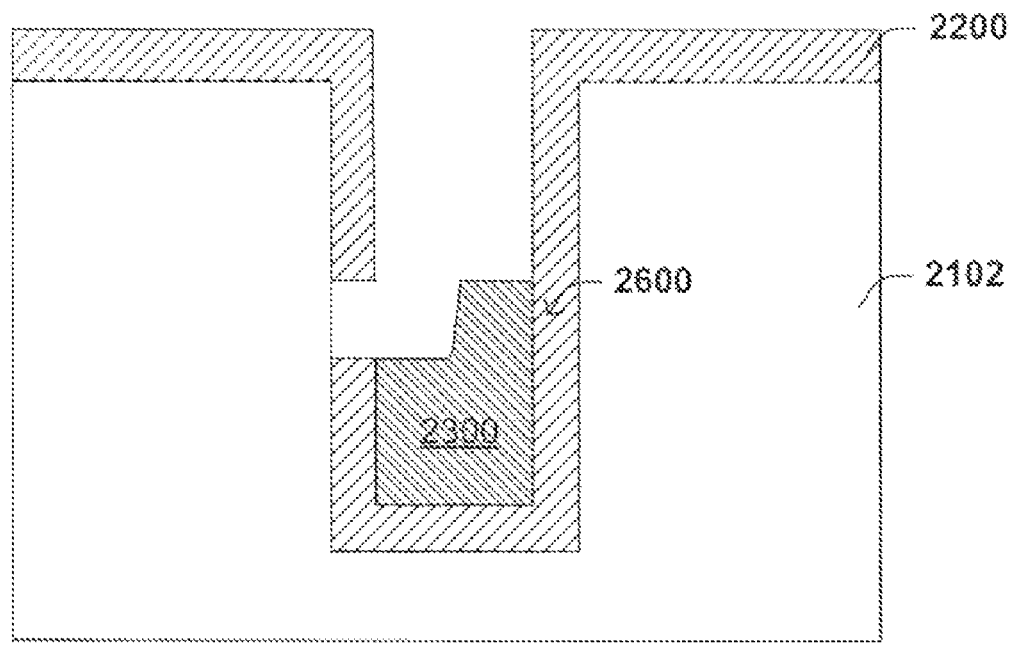

In FIG. 37, the sidewall spacers 3400 are removed.

Figure 38:
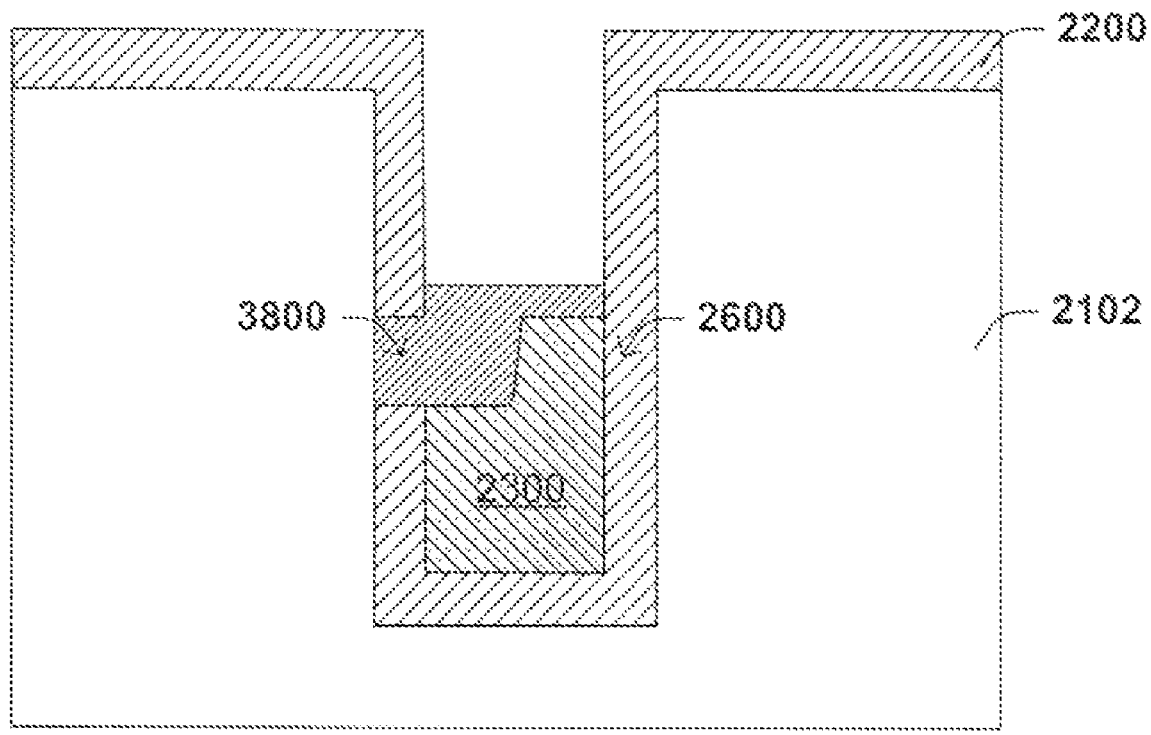

In FIG. 38, conductive material is formed in the trench and recessed to fashion a single-sided contact element 3800. Although not shown, thermal treatments could be used to generate the outdiffusion regions.

While the invention has been illustrated and described with respect to one or more implementations, alterations and/or modifications may be made to the illustrated examples without departing from the spirit and scope of the appended claims. For example, although some embodiments have been illustrated and described above with regard to rectangular or box-shaped buried conductive lines (e.g., wordlines or bitlines), these conductive lines may have other shapes in other embodiments. For example, U-shaped, V-shaped, W-shaped, rod-like, square (cubic), and other shaped buried conductive lines are also contemplated as falling within the scope of the present invention. Further, although many embodiments include a contact element that continuously extends along a connection path between at least two transistors, in some embodiments the contact element may not continuously extend along such a connection path.

In addition, although FIGS. 2-11 show a memory array that includes capacitive storage elements, other embodiments could include other types of data storage elements including, but not limited to: resistive memory elements, ferroelectric memory elements, or cross-coupled inverters. Other embodiments relate to other integrated circuits and semiconductor devices (not merely memory arrays).

All such variations are contemplated as falling within the scope of the present application. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising"

What is claimed is:

1. An integrated circuit formed on a semiconductor body having interconnect between a source/drain region of a first transistor and a source/drain region of a second transistor, the interconnect comprising:
   a metal body arranged underneath the surface of the semiconductor body; and
   a conductive contact element establishing direct electrical conductive contact between the metal body and the source/drain region of the first transistor and the source/drain region of the second transistor, thereby permitting current to pass between the metal body and the source/drain regions of the first and second transistors;
   wherein the contact element extends along a connecting path between the source/drain regions of the first and second transistors.

2. The integrated circuit of claim 1, further comprising:
   a dielectric layer extending under the metal body and extending along opposing sides of the metal body; where the conductive contact element bridges the dielectric layer to establish electrical contact between the metal body and source/drain regions.

3. The integrated circuit of claim 2, further comprising:
   a second insulating layer disposed between the dielectric layer and the metal body, where the second insulating layer is a high-k dielectric material.

4. The integrated circuit of claim 2, where the dielectric layer under the metal body is thicker than the dielectric layer along opposing sides of the metal body.

5. The integrated circuit of claim 2, where the conductive contact element further comprises a silicon nitride (SiN) layer.

6. The integrated circuit of claim 5, where the silicon nitride layer extends continuously from a top surface of the conductive contact element to a bottom surface of the conductive contact element, but has a thickness adapted to allow current to flow through the conductive contact element.

7. The integrated circuit of claim 1, further comprising:
a silicide layer on a top surface of the metal body.

8. The integrated circuit of claim 1, further comprising:
a polysilicon layer arranged underneath the metal body; and
a dielectric layer separating the poly layer from the metal body.

9. The integrated circuit of claim 8, where the polysilicon layer is coupled to a well region buried in the semiconductor body.

10. An integrated circuit, comprising:
a semiconductor body including an array of semiconductor pillars arranged in a series of rows and columns, where pillars within each row and pillars within each column are laterally separated from one another by trenches extending beneath the surface of the semiconductor body;
a metal body arranged within a trench along-side a column of pillars; and
a conductive contact element extending along a connecting path between at least two pillars of the column, the contact element conductively coupling the metal body to the at least two pillars of the column, thereby permitting current to pass between the metal body to the at least two pillars of the column.

11. The integrated circuit of claim 10, further comprising:
a conductive body arranged within a trench along-side a row of pillars; and
a dielectric layer separating the conductive body from the pillars of the row.

12. The integrated circuit of claim 10, further comprising:
data storage elements disposed atop respective semiconductor pillars.

13. The integrated circuit of claim 10, wherein the conductive contact element abuts a pair of adjacent pillars on opposing sides of the trench.

14. The integrated circuit of claim 10, wherein the conductive contact element abuts only one of two pillars on opposite sides of the trench.

15. The integrated circuit of claim 10, wherein the conductive contact element is formed along-side the metal body without extending over the metal body.

16. The integrated circuit of claim 10, wherein the conductive contact element is formed over the metal body without extending along-side the metal body.

17. The integrated circuit of claim 10, wherein the conductive contact element comprises:
a first metal layer; and
a second metal layer, where the first and second metal layers have different workfunctions.

18. The integrated circuit of claim 10, where the metal body is formed in a pocket near the bottom of the trench, the pocket having a width that is larger than a width between sidewalls near the top of the trench.

19. The integrated circuit of claim 10, further comprising:
a dielectric layer extending under the metal body and extending along opposing sides of the metal body; where the conductive contact element bridges the dielectric layer to establish electrical contact between the metal body and source/drain regions.

20. The integrated circuit of claim 19, further comprising:
a second insulating layer disposed between the dielectric layer and the metal body, where the second insulating layer is a high-k dielectric material.

21. The integrated circuit of claim 19, where the dielectric layer under the metal body is thicker than the dielectric layer along opposing sides of the metal body.

22. The integrated circuit of claim 19, further comprising:
a polysilicon layer arranged underneath the metal body;
a dielectric layer separating the poly layer from the metal body; and
where the polysilicon layer is coupled to a well region buried in the semiconductor body.

23. An integrated circuit, comprising:
a semiconductor body including an array of semiconductor pillars arranged in a series of rows and columns, where pillars within each row and pillars within each column are laterally separated from one another by respective trenches extending beneath a top surface of the semiconductor pillars;
first and second metal bodies in a trench along-side a row or column of pillars;
the first and second metal bodies respectively extending along opposing sides of the trench; and
a first conductive contact element disposed beneath the surface of the semiconductor body and conductively coupling the first metal body to at least one pillar on a first side of the trench.

24. The integrated circuit of claim 23, further comprising:
a second conductive contact element coupling the second metal body to at least one pillar on a second side of the trench.

25. The integrated circuit of claim 23, where the trenches are at approximately a minimum feature size resolvable by lithography and the first and second metal bodies have sublithographic dimensions.

* * * * *